(12) United States Patent
Snyder et al.

(10) Patent No.: US 6,320,811 B1
(45) Date of Patent: *Nov. 20, 2001

(54) MULTIPORT MEMORY SCHEME

(75) Inventors: Warren A. Snyder, Snohomish; Paul D. Berndt, Woodinville, both of WA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,889

(22) Filed: Dec. 10, 1998

(51) Int. Cl.$^7$ .................................................. G11C 8/00
(52) U.S. Cl. .............................. 365/230.03; 365/185.11; 365/189.03; 365/230.05
(58) Field of Search ......................... 365/230.03, 230.05, 365/185.11, 189.03

(56) References Cited

U.S. PATENT DOCUMENTS

| | | | |
|---|---|---|---|
| 5,339,279 | * 8/1994 | Toms et al. | 365/230.03 |
| 5,636,163 | * 6/1997 | Furutani et al. | 365/230.03 |
| 5,844,856 | * 12/1998 | Taylor | 365/230.03 |
| 5,867,436 | * 2/1999 | Furutani et al. | 365/230.03 |
| 5,875,132 | * 2/1999 | Ozaki | 365/230.03 |
| 5,930,168 | * 10/2000 | Roohparvar | 365/185.03 |
| 5,959,887 | * 9/1999 | Takashina et al. | 365/185.11 |
| 5,969,986 | * 10/1999 | Wong et al. | 365/185.03 |
| 6,023,428 | * 2/2000 | Tran | 365/189.04 |
| 6,128,242 | * 10/2000 | Banba et al. | 365/226 |

* cited by examiner

Primary Examiner—Amir Zarabian
Assistant Examiner—VanThu Nguyen
(74) Attorney, Agent, or Firm—Christopher P. Maiorana, P.C.

(57) ABSTRACT

A circuit comprising a memory array having a first region, a second region, a plurality of bitlines and an X-decoder. A plurality of transistors may each coupled between the first and second regions, where each of the transistors may be configured to (i) separate the first and the second region during a read operation and (ii) join the first and the second region during a write operation. Alternatively, a plurality of memory regions may be implemented, each separated by another plurality of transistors.

18 Claims, 3 Drawing Sheets

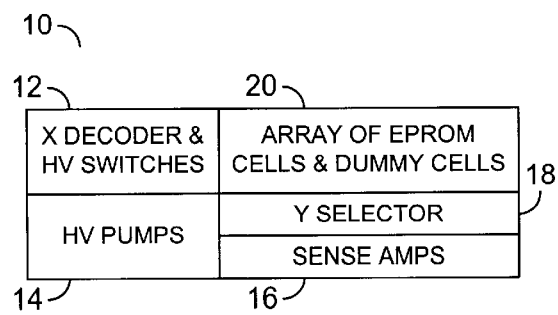
FIG. 1
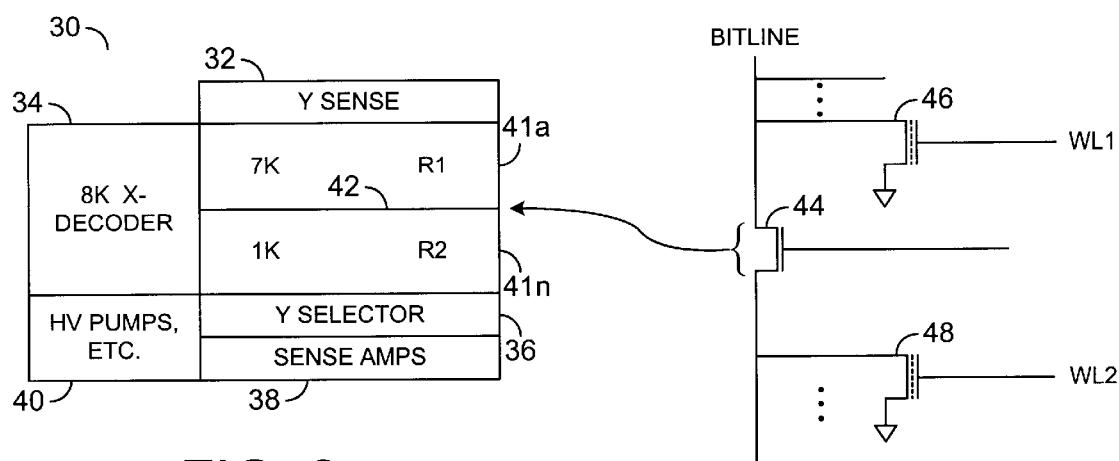
FIG. 2a
FIG. 2b
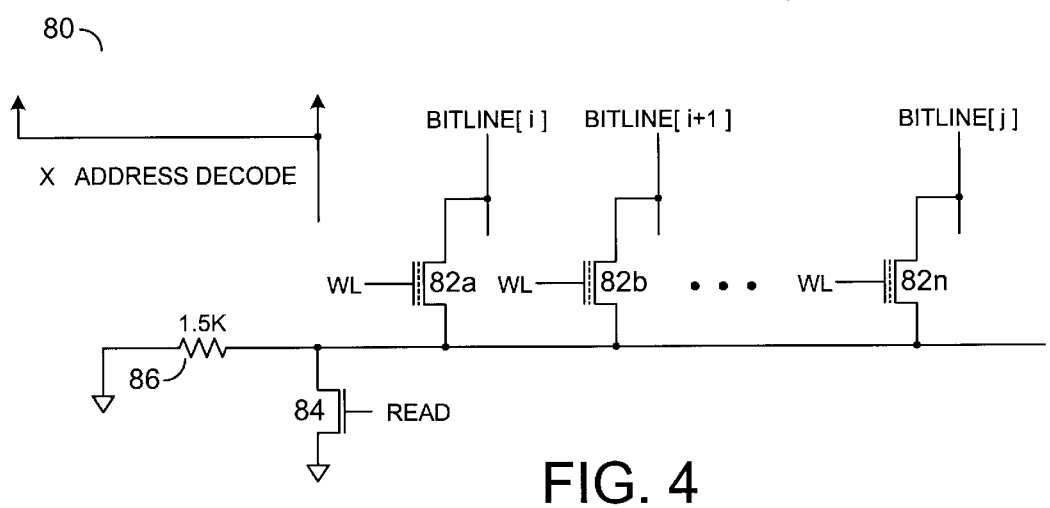
FIG. 4

MULTIPORT MEMORY SCHEME

FIELD OF THE INVENTION

The present invention relates to memories generally and, more particularly, to a multiport memory scheme and writeable read only memories.

BACKGROUND OF THE INVENTION

Conventional approaches to implementing memories required the support circuitry to be duplicated for each memory. Such a duplication may be a limiting factor in small memories, such as those used with microprocessors. Additional real estate is required to duplicate the support circuitry to implement each memory. FIG. 1 illustrates a memory array 10 illustrating one such conventional approach. The memory array 10 generally comprises an X-decoder and HV switch section 12, an HV pump section 14, a sense amplifier section 16, a Y-selector section 18 and an array of memory cells 20. For a 4k-byte EPROM, may be implemented using 128 rows of 256 columns of EPROM cells. The Y-selector 18 selects thirty-two columns into eight groups of outputs to achieve 1-byte of output. 7-bits of X-addresses are decoded to generate one of 128 wordlines. During a read operation, the wordlines are driven to zero volts, except for a one word line which is driven to the supply voltage Vcc. The sense amplifier 16 drives a current through one of thirty-two bit lines to sense the presence of the cell.

The erased cell has a threshold voltage Vtn of approximately 1.0 volts, while the program threshold voltage Vtn is approximately 6.0 volts (which is much greater than the supply voltage Vcc). Therefore, a program cell draws no current and the bit line will go to a high voltage while an erased cell will draw current and the first bit line will go to a low voltage. The sense amplifier 18 determines the difference as a data logic bit. A dummy PROM cell is always erased and hence acts as a current load reference to compare against.

During programming, the special circuitry drives the bit lines to a high voltage and the word line is driven to a voltage greater than the Vpp (approximately 14 volts). The X-decoders, the y-selector and sense amplifiers all must accommodate the extra stresses of high voltage programming. The overhead for this circuitry is very high for memories up to 32k bytes, which is typical to microcontrollers.

Conventional EPROM and E2PROM requires substantial extra circuitry that performs voltage boosting, high voltage switching and current sensing that normally accounts for about 50% or more of the overall area when PROMS are built. Therefore, if two PROMS are used on the same die, one usually pays this overhead twice in some form. Some conventional approaches use the high voltage generators for each of the PROMS, but do not generally use other support circuitry.

SUMMARY OF THE INVENTION

The present invention concerns a circuit comprising a memory array having a first region, a second region, a plurality of bitlines and an X-decoder. A plurality of transistors may each coupled between the first and second regions, where each of the transistors may be configured to (i) separate the first and the second region during a read operation and (ii) join the first and the second region during a write operation. Alternatively, a plurality of memory regions may be implemented, each separated by another plurality of transistors.

The objects, features and advantages of the present invention include providing a memory that splits the bitlines into two or more partitions that may be used to generate separately memory addressable sections that can share a number of common support circuitry components. The present invention may share the overhead between two PROMS by building a single ROM with two distinct memories.

BRIEF DESCRIPTION OF THE DRAWINGS

These and other objects, features and advantages of the present invention will be apparent from the following detailed description and the appended claims and drawings in which:

FIG. 1 is a block diagram of a conventional memory;

FIGS. 2a, 2b is a block diagram of a memory in accordance with a preferred embodiment of the present invention;

FIG. 4 illustrates a floating gate EPROM cell that may be used with the present invention;

DETAILED DESCRIPTION OF THE PREFERRED EMBODIMENTS

Figure 3:
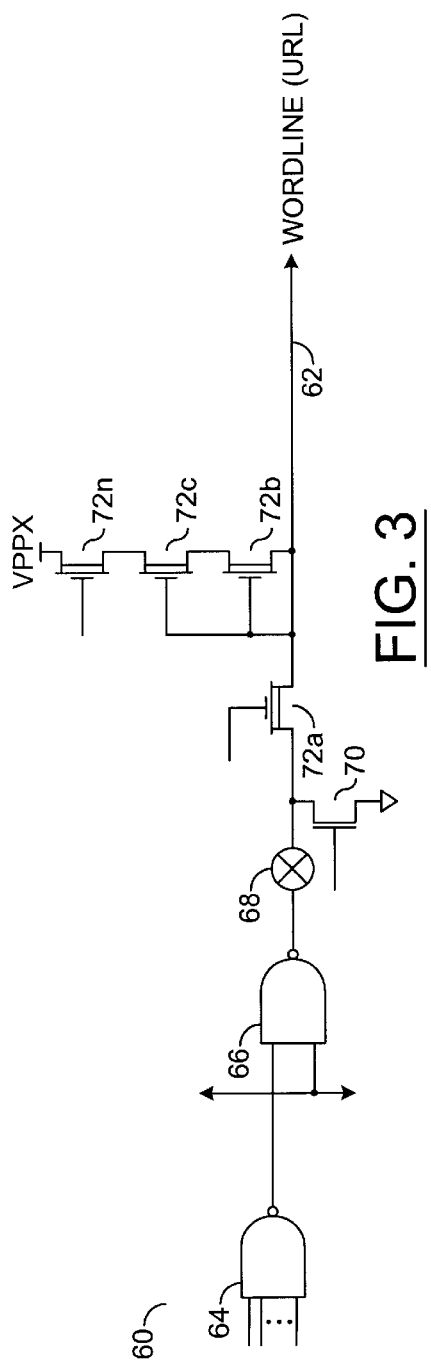
FIG. 3 illustrates a bit line that may be used with the present invention.

In a preferred embodiment of the present invention, an EPROM may be split into two or more regions that may each be used independently. The bitlines are electrically separated into the two or more regions by one or more a high voltage tolerant NMOS transistors. The transistors may join the two regions during programming, yet separate the regions during reading. As a result, the X-decoder and other support circuitry does not have to be duplicated for each of the memory regions. In some applications, a separate sense amplifier and Y-selector may still be required for the second, and subsequent, regions. However, in many applications, the Y-multiplexer and the number of outputs can be different for each of the two regions.

Examples of particular sizes of memories that may be useful may be implementing two 4K memories from an 8K array, a 7K and a 1K group from an 8K array, etc. The splitting may be particularly useful where only a few programming bits are needed in one portion of the array while the remaining portion is used for more detailed and memory dependent systems.

Referring to FIG. 2, a block diagram of a memory 30 is shown in accordance with a preferred embodiment of the present invention. The circuit 30 generally comprises a Y-sense block 32, an X-decoder block (or circuit) 34, a Y-selector block (or circuit) 36, a sense amplifier block (or section) 38, a high voltage pump block (or circuit) 40, a memory section 41a (e.g., R1) and a memory section 41n (e.g., R2). A dotted line 42 generally represents the splitting of the memory section 41a and the memory array 41n. FIG. 2a illustrates an example where an 8K memory is divided into a 7K region (R1) and a 1K region (R2). FIG. 2b illustrates an example of a high voltage transistor 44 that may be used to separate the regions 41a and 41n. FIG. 2b also illustrates a transistor 46 and a transistor 48 that may be used to implement the memory cells of the memory arrays 41a and 41n. The transistor 44 takes up a small amount of area compared to the transistors that make up the memory cells (e.g., transistors 46 and 48).

While the circuit 30 is shown having a memory section 41a and a memory section 41n, more than two memory sections may be implemented. For example, a number of memory sections greater than two (e.g., from 2 to 8, more preferably, 2, 3 or 4, but most preferably 2) may be implemented. The transistors 46 and 48 may be implemented as electrically programmable read only memories (EPROMs), electrically erasable programmable read only memories (EEPROMs), flash memories, random access memories (RAM), or any other memory that may be wordline driven and divided into sections or ports as shown in the present invention.

Referring to FIG. 3, a circuit 60 is shown illustrating wordline 62. The circuit 60 generally comprises a gate 64, a gate 66, a fuse 68, a transistor 70 and a number of transistors 72a–72n. The transistors 72a–72n may be high voltage switches. The gates 64 and 66 may be implemented as NAND gates.

Referring to FIG. 4, a circuit 80 is shown comprising a number of floating gates EPROM cells 82a–82n. Each of the cells 82a–82n is generally connected to bitline[i], a bitline [i+1] and a bitline[j], respectively, where the number j may represent the number of bitlines in the memory 30. Additionally, each of the cells 82a–82n is connected to a wordline WL, that controls the functioning of the cell. A transistor 84 and a resistor 86 are generally coupled to the bitlines, through the cells 82a–82n.

Figure 5:
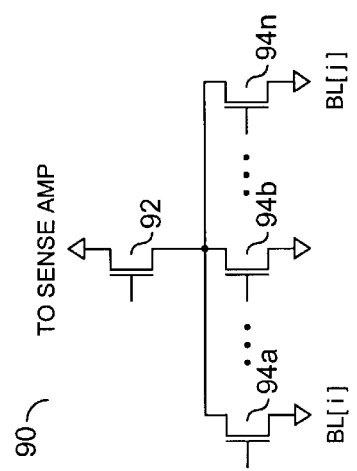
FIG. 5 illustrates a column multiplexer and selector that may be used with the present invention.

Referring to FIG. 5, a column multiplexer/selector circuit 90 is shown. The circuit 90 generally comprises a transistor 92 and a number of transistors 94a–94n. The transistors 94a–94n are generally connected between the transistor 92 and the bitlines BL[i–j]. The transistor 92 generally connects the transistors 94a–94n to the sense amplifier 38. The number of bitlines BL[i–j] may be adjusted accordingly to meet the design criteria of a particular application. In one example, 32 bitlines may be implemented per sense amplifier. However, a greater or smaller number of bitlines, such as 72 bitlines, may be implemented per sense amplifier, if necessary.

Figure 6:
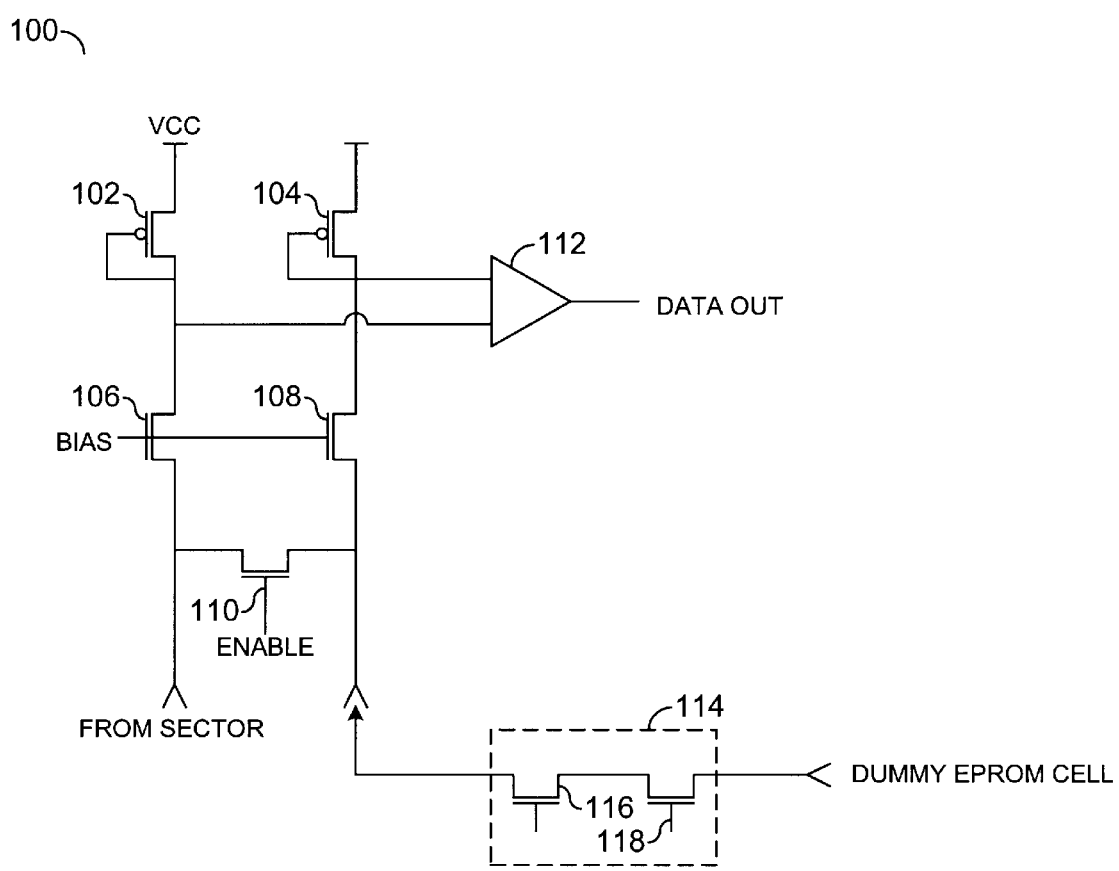
FIG. 6 illustrates a sense amplifier that may be used with the present invention.

Referring to FIG. 6, a sense amplifier 100 is shown. The sense amplifier 100 generally comprises a transistor 102, a transistor 104, a transistor 106, a transistor 108, a transistor 110, a buffer 112, and a dummy EPROM cell 114. The dummy EPROM cell 114 may comprise a transistor 116 and a transistor 118. An example of a dummy EPROM cell may be found in U.S. Pat. No. 5,689,971, which is incorporated by reference in its entirety. The transistor 110 may receive an enable signal and the transistors 106 and 108 may receive a bias signal. The transistors 102 and 104 may present an output signal (e.g., DATAOUT), through the buffer 112. The sense amplifier 100 is one example of a sense amplifier that may be used with the present invention. Other sense amplifiers may be substituted accordingly to meet the design criteria of a particular application. For example, the sense amplifier in U.S. Pat. Nos. 5,737,274 and 5,748,021, entitled SENSE AMPLIFIER DESIGN and IMPROVED SENSE AMPLIFIER DESIGN WITH DYNAMIC RECOVERY, which are hereby incorporated by reference in their entireties may be implemented.

Figure 7:
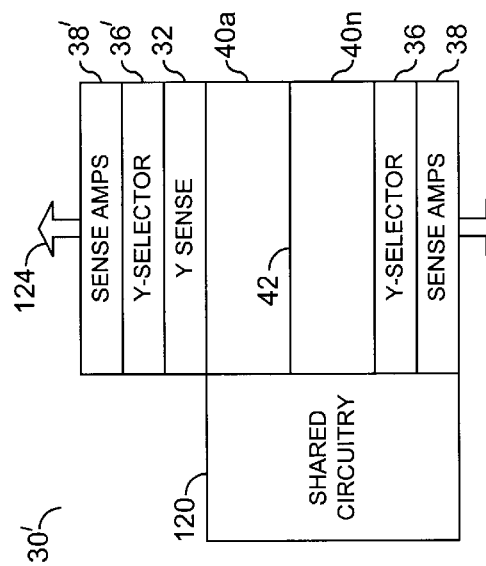
FIG. 7 illustrates a block diagram of the circuit of FIGS. 2a and 2b further illustrating additional Y-selectors and sense amplifiers.

Referring to FIG. 7, a more detailed block diagram of a circuit 30' is shown. The circuit 30' further includes a second Y-selector block 36' and a second sense amplifier block 38'. A shared circuitry block 120 may represent the X-decoder block 34 and the HV pump block 40 of the circuit 30 of FIG. 2a. The sense amplifier block 38 provides an output 122 and the sense amplifier block 38' provides an output 124. The outputs 122 and the outputs 124 are generally multi-bit outputs. Additionally, the output 122 may be considered a first port and the output 124 may be considered a second port, making the circuit 30' a multi-port memory.

When implementing the memory 30 with more than two memory sections 41a–41n, a second set of high voltage transistors 44 as well as a second set of Y-selectors 36 and sense amplifiers 38 may be implemented. In one example, the second set of Y-selectors 36 and sense amplifiers 38 could be implemented in a generally perpendicular fashion with respect to the dotted line 42 in FIG. 2a. This would allow the circuit 30 to be divided into four regions 41a–41n. Additional regions may be implemented by adding more sets of high voltage transistors 44 and more sets of Y-selectors 36 and sense amplifiers 38.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a memory comprising (i) a first region, (ii) a second region, (iii) a plurality of bitlines running through said first and second regions and (iv) write decoding circuitry coupled to said first region and said second region; and
    a plurality of transistors each coupled in one of said plurality of bitlines between the first and second regions, wherein each of said transistors is configured to (i) electrically separate said first region and said second region during a read operation to enable reading from said first region through a first port and reading from said second region through a second port and (ii) electrically join said first region and said second region during a write operation, wherein said first and second regions are (i) configured to share said write decoding circuitry and (ii) written to only when said regions are joined.

2. The circuit according to claim 1, wherein the first region has a size equal to a size of the second region.

3. The circuit according to claim 1, wherein the first region has a size different than a size of the second region.

4. The circuit according to claim 1, wherein said plurality of transistors are high voltage tolerant transistors.

5. The circuit according to claim 1, wherein said memory further comprises a Y-decoder.

6. The circuit according to claim 1, wherein:
    said first region comprises a first Y-selector circuit and a first sense amplifier circuit; and
    said second region comprises a second Y-selector circuit and a second sense amplifier circuit.

7. The circuit according to claim 1, further comprising:
    a plurality of regions, wherein said plurality of regions are joined during a write operation and separated during a read operation allowing separate reading operation from said plurality of regions.

8. The circuit according to claim 1, wherein said write decoding circuitry comprises an X-decoder configured to decode an address.

9. The apparatus according to claim 1, wherein said write decoding circuitry includes a high voltage charge pump.

10. A circuit comprising:
- a memory comprising (i) a first region, (ii) a second region, (iii) a plurality of bitlines running through said first and second regions and (iv) write decoding circuitry coupled to said first region and said second region; and
- means for electrically separating said first and said second region to enable reading from said first region through a first port and reading from said second region through a second port and (ii) electrically joining said first region and said second region during a write operation, wherein said first and second regions are (i) configured to share said write decoding circuitry and (ii) written to only when said regions are joined.

11. A method for dividing a memory comprising the steps of:
- (A) configuring said memory as (i) a first region and (ii) a second region;
- (B) electrically separating said first region and said second region during a read operation and reading said first region from a first port and said second region from a second port;
- (C) electrically joining the first region and the second region during a write operation, wherein said first and second regions are (i) configured to share write decoding circuitry and (ii) written to only when said regions are joined; and
- (D) decoding address information for said first region and said second region using said write decoding circuitry.

12. The method according to claim 11, wherein said first region has a size equal to a size of said second region.

13. The method according to claim 11, wherein said first region has a size different than a size of said second region.

14. The method according to claim 11, wherein steps (b) and (c) are performed using a plurality of transistors.

15. The method according to claim 14, wherein said plurality of transistors are high voltage tolerant transistors configured to write to the combined regions.

16. The method according to claim 11, further comprising the steps of:
- connecting a first port to said first region; and
- connecting a second port to said second region, wherein said first port reads from said first region of said memory and said second port reads from said second region of said memory.

17. The method according to claim 11, further comprising:
- storing information in a plurality of regions, wherein said plurality of regions are joined during a write operation and separated during a read operation.

18. The method according to claim 11, wherein said write decoding circuitry includes a high voltage charge pump.

* * * * *